United States Patent [19]

Plagens

[11] Patent Number: 5,016,079
[45] Date of Patent: May 14, 1991

[54] INTEGRATED INJECTION LOGIC GATE WITH HEAVILY DOPED DIFFUSION

[75] Inventor: Mark R. Plagens, Richardson, Tex.

[73] Assignee: Honeywell Inc., Minneapolis, Minn.

[21] Appl. No.: 444,066

[22] Filed: Nov. 30, 1989

[51] Int. Cl.$^5$ .................. H01L 27/02; H01L 29/72
[52] U.S. Cl. .......................... 357/43; 357/35; 357/36; 357/92
[58] Field of Search .................. 357/35, 36, 92, 43

[56] References Cited

U.S. PATENT DOCUMENTS 4,412,142 10/1983 Ragonese et al. .................. 357/92
4,779,126 10/1988 Herman .................. 357/36

Primary Examiner—William Mintel
Assistant Examiner—R. Potter
Attorney, Agent, or Firm—Robert B. Leonard

[57] ABSTRACT

A structure for an Integrated Injection Logic (I$^2$L) gate is disclosed in which gate gain $\alpha^*\beta$ is improved and leakage current at the silicon-silicon dioxide interface is reduced. A plug of highly doped material is interposed between the emitter and the collector of the lateral transistor to accomplish these goals.

2 Claims, 2 Drawing Sheets

INTEGRATED INJECTION LOGIC GATE WITH HEAVILY DOPED DIFFUSION

BACKGROUND OF THE INVENTION

This invention is directed toward the field of integrated logic gates. More specifically, the present invention is a structure for an integrated injection logic ($I^2L$) Gate which provides a reduced leakage current in a high temperature, high voltage application, along with increased gate current gain and a method for producing such a structure.

$I^2L$ gates are useful where a dense concentration of circuits is required on a chip, due to the compact size of each gate. However, $I^2L$ gates have been plagued by problems such as low current gain ($\beta$) and power loss in the lateral transistor when implemented in high temperature, high voltage, bipolar processes. Current loss occurs at the silicon-silicon dioxide interface due to the presence of interface traps whch attract the holes and electrons and causes recombination. The area of this recombination zone is dependent upon doping concentration and temperature. Current loss between the emitter and collector of a transistor affects the transistor's $\beta$.

One attempted solution to reduce power loss in $I^2L$ gates is the device disclosed in U.S. Pat. No. 4,260,988 issued to Russell. This patent discloses an $I^2L$ gate with a double diffused injector transistor which can be configured with a high resistance region between its base and ground as shown in FIGS. 6B and 6C of the cited patent. This additional resistance, it is claimed, reduces parasitic leakage in the injector transistor. However, the double diffused injector and the use of the common substrate as the emitter of the vertical output transistor are incompatible with a high voltage, analog-digital bipolar process having lightly doped epitaxial and substrate.

SUMMARY OF THE PRESENT INVENTION

The present invention is an $I^2L$ gate structure and method of manufacturing the gate, which allows the usage of an $I^2L$ gate with reduced leakage current and power loss in high temperature and high voltage applications. The present $I^2L$ gate structure introduces a heavily doped-low resistance diffusion between the emitter and collector of the lateral transistor. Introduction of the heavily doped low resistance diffusion reduces the area in which leakage current can occur at high temperature, thus improving lateral PNP $\beta$. Further, the heavily doped diffusion reduces parasitic back injection of current from the vertical transistor base, improving current gain.

DETAILED DESCRIPTION OF THE DRAWINGS

Figure 1:
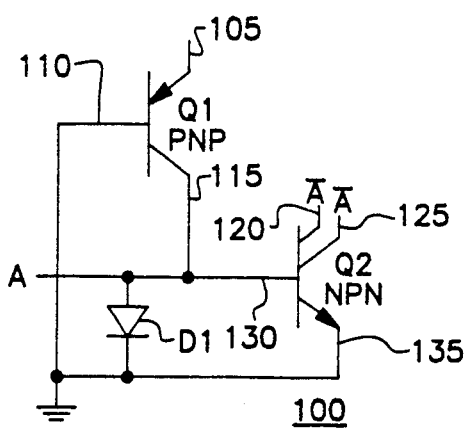
FIG. 1 is a schematic diagram of an $I^2L$ gate.

Referring now to FIG. 1, thereshown is a schematic diagram of an $I^2L$ gate 100. Q1 identifies a PNP transistor comprised of emitter 105, base 110 and collector 115. Q2 identifies a NPN transistor having a pair of collectors 120, 125, a base 130 and an emitter 135. Diode D1 represents the large junction between the base 130 of Q2 and lower layers of the chip. D1 will be described in further detail during discussion of FIG. 2.

Emitter 105 of Q1 is connected to a current source (not shown) and is commonly called the injector. Base 110 of Q1 and emitter 135 of Q2 are tied to ground. Collector 115 of Q1 is connected with base 130 of Q2. The base 130 of Q2 is also known as the input for the gate 100. Collectors 120 and 125 of Q2 serve as a the outputs for the gate. It is to be understood that alternatively Q1 may be an NPN type transistor and Q2 may be a PNP type transistor, with appropriate connection changes which would be obvious to one of ordinary skill in the art.

Figure 1A:
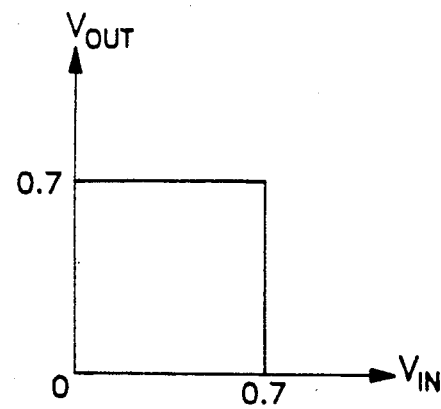
FIG. 1A shows the transfer characteristic of the $I^2L$ gate.

$I^2L$ gate 100 acts as an inverter. It receives a high or low level digital signal input at base 130 and provides a signal at outputs 120 and 125 which is at the opposite level of the input. The ideal transfer characteristic of gate 100 is shown in FIG. 1A.

Figure 2:
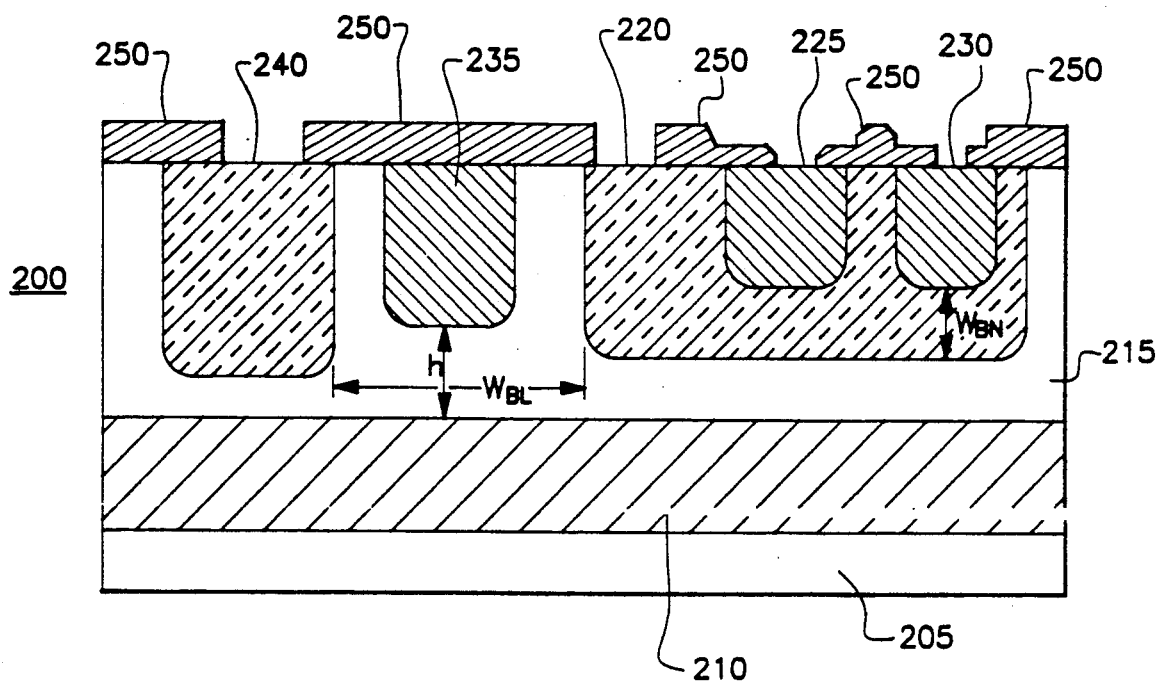
FIG. 2 is a side view of a chip having the inventive $I^2L$ gate.
Figure 3:
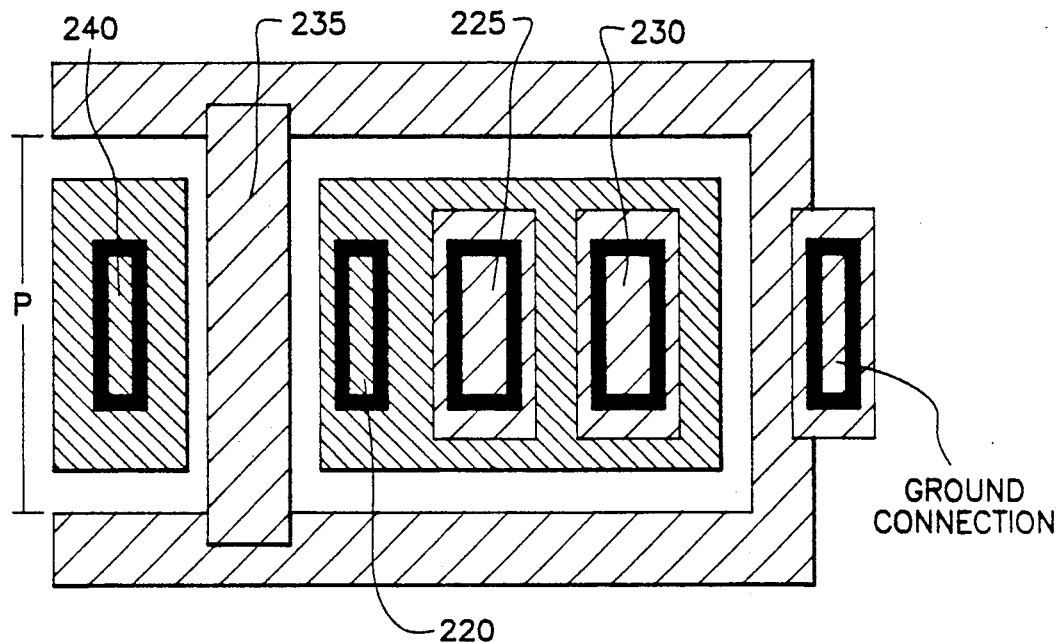
FIG. 3 is a top view of a chip having the inventive $I^2L$ gate.

The transistors, Q1 and Q2 which comprise an $I^2L$ gate may be built on the same chip. Such a monolithic construction for gate 100 is shown in FIGS. 2 and 3. All layers of the chip shown in FIGS. 2 and 3 are made from silicon. Any layers identified as being made of P type material are constructed from silicon doped with an impurity from chemical group III such as boron which provides extra holes into which electrons may flow. Layers identified as being N type are doped with impurity atoms from chemical group V such as phosphorous which provides extra electrons for current flow. Some layers may be identified as P+, P−, N+ or N−type layers. The + or − relates to the number of impurity atoms introduced into the silicon, + indicating more than a normal concentration, − indicating lower than a normal concentration.

FIG. 2 is a side view of a chip 200 containing an $I^2L$ gate of the present invention. Chip 200 is comprised of a substrate 205 made of a P type material. Next, N+type layer 210 is diffused into the upper surface of substrate 205. On top of layer 210, N type layer 215 is epitaxially grown. Layer 215 forms both the base 110 of Q1 and the emitter at 135 of Q2.

Region 240 of P type material is then diffused into layer 215 and forms the emitter 105 of Q1, also known as the injector. Region 220 of P type material is also diffused into layer 215. Region 220 is both the collector 115 of Q1 and the base 130 of Q2.

Within region 220, two regions 225 and 230 are formed and serve as collectors 125 and 120 for transistor Q2. Regions 225 and 230 are both diffused into region 220 and are composed of N+type material. As an alternative, many such regions may be formed to serve as outputs for gate 100.

A plug 235 of highly doped material (N+) is diffused between region 240, the emitter of Q1 and region 220, the collector of Q1.

Finally, silicon dioxide ($SiO_2$) 250 is deposited on the upper surface of the chip, leaving small regions uncovered over regions 240, 220, 225 and 230 in order to allow electrical contact with the outside world.

By inserting plug 235 between regions 240 and 220, the current gain, $\alpha * \beta$ of the I²L gate is increased, and leakage currents at the silicon-silicon dioxide interface is reduced.

Figure 4:
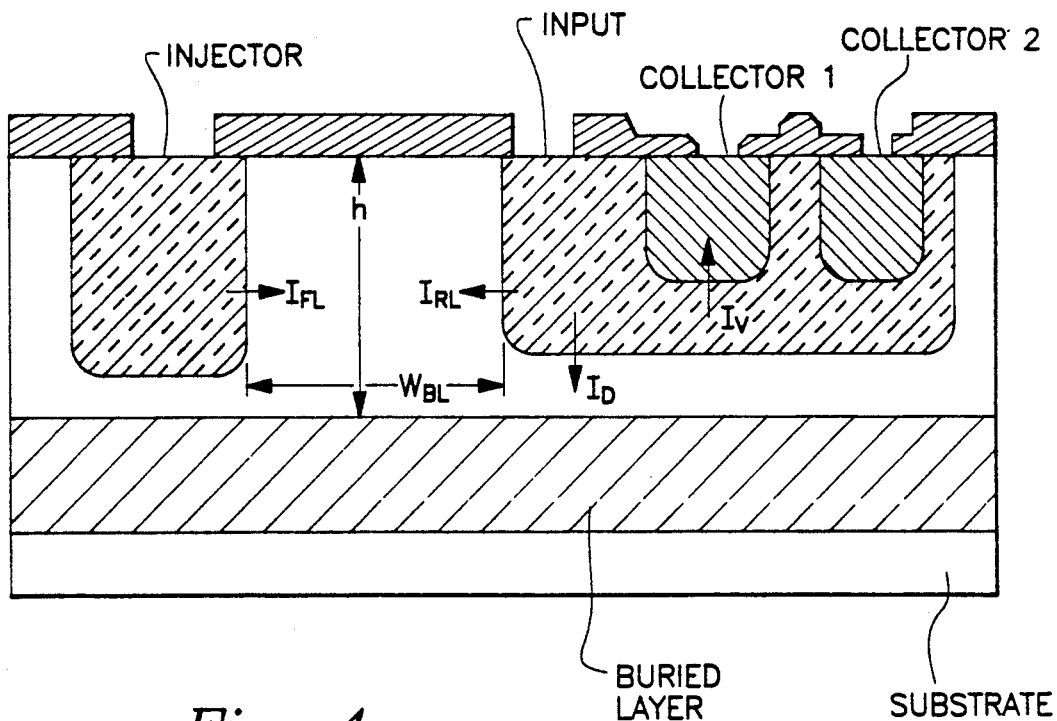
FIG. 4 is a side view of the chip structure of an $I^2L$ gate of the prior art.

In designing an I²L gate, current gain is important. In order for the I²L gate to properly perform its inverting function, the current reaching the base 130 of Q2, which is equal to the current entering the emitter of Q1 105 $I_e$ multiplied by $\alpha$, multiplied by the $\beta$ of Q2, must be sufficient to sink the injector current of a subsequent gate. The $\alpha * \beta$ product can be expressed as:

$$\alpha * \beta = \frac{N_d D_n A_e}{N_a D_p W_{bn} \left[ \frac{P \cdot h}{W_{b1}} + \frac{A_d}{L_p} \right]}$$

where:
$N_d$ equals donor concentration of Q1's base region, $D_n$ equals diffusion constant for electrons, $A_e$ equals the emitter area of Q2 (area of region 225 in FIG. 3), $N_a$ equals acceptor density of Q2's base, $D_p$ equals diffusion constant for holes, $W_{bn}$ equals base width of Q2, P equals perimeter of Q1, h equals effective height of Q1's base, $W_{bl}$ equals base width of Q1, $A_d$ equals area of Q2's base diode $D_1$ (area of region 220 in FIG. 3), and $L_p$ equals the diffusion length of the minority carriers. The points between which the measurements are taken are shown in FIGS. 2 and 3. FIG. 4 shows the $W_{bl}$ and h measurements in an I²L gate of the prior art. The insertion of the plug 235 between the emitter 105 and collector 115 of Q1 effectively increases base width $W_{bl}$ and reduces Q1's base height, h. Modification of the $W_{bl}$ and h terms in this manner result in a larger $\alpha * \beta$ product or in other words, higher current gain for the gate.

In order to obtain an $\alpha * \beta$ product of approximately 6.6, the following values for the variable terms were used: $N2 = 3 \times 10^{15}$ donors/cm³, $Ae = 64 \times 10^{-8}$ cm2, $Na = 1 \times 10^{16}$ acceptors/cm³ $W_{bn} = 1 \times 10^{-4}$ cm, $p = 15 \times 10^{-4}$ cm, $h = 3.5 \times 10^{-4}$ $W_{bL} = 8 \times 10^{-4}$ cm, $A_d = 550 \times 10^{-8}$ cm2, $Lp = 30 \times 10^{-4}$. By varying the size of plug 235, other $\alpha * \beta$ products can be produced.

Another design consideration in creating an I²L chip is to try to reduce leakage current at the silicon-silicon dioxide interfaces. Introduction of plug 235 which is highly doped between emitter 105 and collector 115 of Q1 reduces depletion layer widths at the silicon/silicon-dioxide interface of the IC. The reduction in depletion layer widths in turn causes less temperature generated current and allows the chip to be used in high temperature applications.

It should be noted that while one embodiment using a lateral PNP transistor Q1 and a vertical PNP transistor Q2 has been described here, a lateral NPN transistor and a vertical PNP transistor could be used as well. In such a case, a plug of P+ type of material would be used as opposed to the N+ plug used in the herein described embodiment.

While the foregoing is a description of the best mode of practicing the claimed invention, other modes of practicing the claimed invention will be obvious to one of ordinary skill in the art. The applicant does not intend to be limited to solely the invention described within the specification, but instead intends to be limited to the invention as defined by the following appended claims.

I claim:
1. A semiconductor device, comprising:
   a substrate having a first conductivity type and a major surface;
   a first layer having a second conductivity type and a first doping concentration formed on said major surface and having an upper planar surface;
   a second layer having said second conductivity type and a second doping concentration lower than said first doping concentration said second layer being formed on said first layer's upper planar surface;
   spaced first and second regions formed within said second layer, said first and second regions being of opposite conductivity type from said second layer, said second region having spaced third and fourth regions formed therein of opposite conductivity type from said secon region; and
   a distinct fifth region formed in said second layer between said first and second regions, said fifth region being of the same conductivity type as said second layer but having said first doping concentration.

2. The structure of claim 1 wherein said substrate is of P type material, said first layer is comprised of N+ type silicon material, said second layer is comprised of N type silicon type material, said first and second regions are comprised of P type silicon material, and said third, fourth and fifth regions are comprised of N+ type silicon material.

* * * * *